United States Patent
Matsuda et al.

(10) Patent No.: US 8,476,572 B2
(45) Date of Patent: Jul. 2, 2013

(54) OPTICAL RECEIVER CIRCUIT

(75) Inventors: Shougo Matsuda, Tachikawa (JP);
Hiroyuki Yoshioka, Akishima (JP);
Ryuichi Satomura, Tsurugashima (JP);
Hideyuki Takahashi, Hachioji (JP);
Akihiko Goto, Ome (JP)

(73) Assignee: Hitachi, Ltd., Tokyo (JP)

(*) Notice: Subject to any disclaimer, the term of this patent is extended or adjusted under 35 U.S.C. 154(b) by 361 days.

(21) Appl. No.: 12/987,116

(22) Filed: Jan. 8, 2011

(65) Prior Publication Data

US 2011/0180692 A1    Jul. 28, 2011

(30) Foreign Application Priority Data

Jan. 27, 2010    (JP) .................................. 2010-014985

(51) Int. Cl.
*H03F 3/08* (2006.01)
*H01J 43/00* (2006.01)
*H01J 43/30* (2006.01)
*H04B 10/06* (2006.01)

(52) U.S. Cl.
USPC .................. 250/214 A; 250/214 LA; 398/202

(58) Field of Classification Search
USPC ............ 250/214 A, 214 LA, 214 R; 327/101; 330/254, 308; 398/202–213
See application file for complete search history.

(56) References Cited

U.S. PATENT DOCUMENTS

| 5,875,050 | A | * | 2/1999 | Ota ................................ 398/202 |
| 6,072,366 | A | * | 6/2000 | Maeda et al. .................. 330/254 |
| 7,418,213 | B2 | | 8/2008 | Denoyer |
| 2007/0212081 | A1 | * | 9/2007 | Takahashi et al. ............. 398/202 |

FOREIGN PATENT DOCUMENTS

| JP | 2002-368112 A | 12/2002 |
| JP | 2003-332855 A | 11/2003 |
| JP | 2008-507943 T | 3/2008 |

* cited by examiner

*Primary Examiner* — Thanh Luu
*Assistant Examiner* — Renee Naphas
(74) *Attorney, Agent, or Firm* — Miles & Stockbridge P.C.

(57) ABSTRACT

An optical receiver circuit is configured as follows: a preamplifier and a reference voltage generating circuit are connected with a first ground potential wiring and a first power supply wiring, which are used in common, and are formed in a first region where elements are formed on a substrate to which the potential of the first ground potential wiring is supplied; a main amplifier is connected with a second ground potential wiring and a second power supply wiring, which are separated from the first ground potential wiring and the first power supply wiring, and is formed in a second region where elements are formed on the substrate to which the potential of the second ground potential wiring is supplied; and a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

20 Claims, 15 Drawing Sheets

FIG. 4
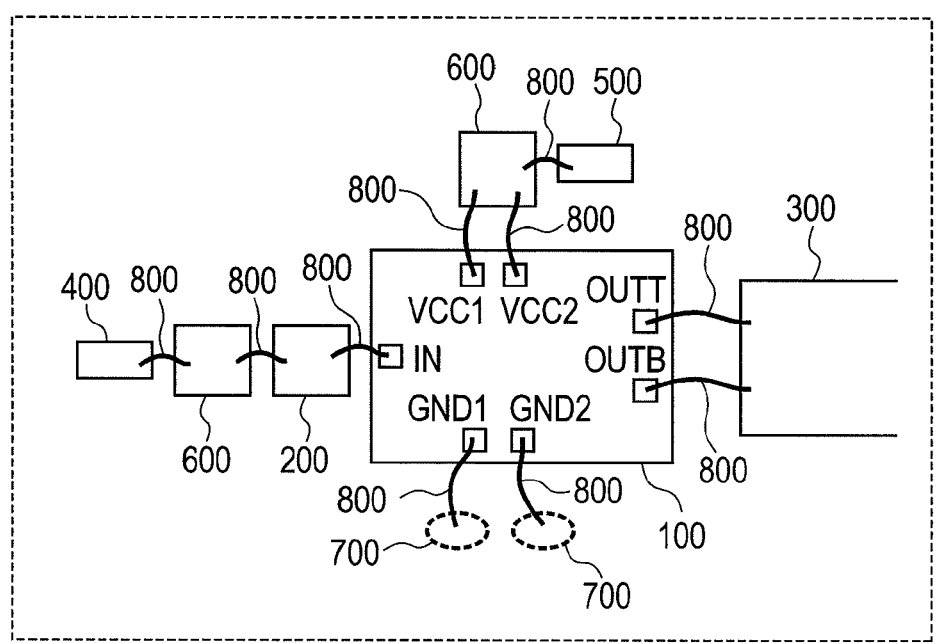
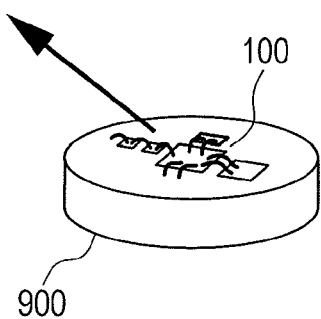

OPTICAL RECEIVER CIRCUIT

CLAIM OF PRIORITY

The present application claims priority from Japanese patent application JP 2010-014985 filed on Jan. 27, 2010, the content of which is hereby incorporated by reference into this application.

FIELD OF THE INVENTION

The present invention relates to an optical receiver circuit for converting a current signal, which has been generated by a photoelectric conversion circuit, into a voltage signal or a differential voltage signal, and more particularly, to an optical receiver circuit of a gigabit order.

BACKGROUND OF THE INVENTION

As a technique for reducing high-frequency noise leak through power supply wiring in an optical receiver circuit, there has conventionally been a technique in which a main amplifier is supplied with a power supply voltage by second power supply wiring separated from first power supply wiring by which a preamplifier is supplied with the power supply voltage (for example, see JP-A-2003-332855).

In addition, as a technique for reducing an influence on an output signal of an optical receiver circuit, the influence being produced as follows: high-frequency noise that has leaked into an preamplifier and a reference voltage generating circuit in the optical receiver circuit appears as a difference between output signals of the preamplifier and the reference voltage generating circuit, because the ground impedances of the preamplifier and the reference voltage generating circuit are different from each other; and the difference is then amplified by a main amplifier, there has conventionally been a technique in which the cathode of a photodiode is connected with the ground potential wiring in the optical receiver circuit through a bypass capacitor, in order to make the ground impedances of the preamplifier and the reference voltage generating circuit equal (for example, see JP-T-2008-507943).

In addition, as a technique for improving the resistance to static electricity of a broadband optical receiver circuit, there has conventionally been a technique in which the input-stage transistor in a preamplifier in an optical receiver circuit is provided with power supply wiring that is independent from other circuit elements in the optical receiver circuit (for example, see JP-A-2002-368112).

SUMMARY OF THE INVENTION

An optical receiver circuit is generally required to amplify a weak current signal, which has been generated by a photoelectric conversion circuit, such as a photodiode, and to convert it into a voltage current, in particular, into a differential voltage signal. The optical receiver circuit generally comprises: a preamplifier to convert a current signal from a photodiode, etc., into a voltage output signal; a reference voltage generating circuit to generate a direct current (DC) voltage necessary for single-to-differential conversion; and a main amplifier to receive, as inputs, a first voltage signal outputted by the preamplifier and a second voltage signal outputted by the reference voltage generating circuit, and to output a voltage signal or a differential voltage signal by amplifying the differential component between the first and second voltage signals. Conventionally, an integrated circuit (IC) integrated on a single semiconductor substrate has been used in the optical receiver circuit. It is general that, in the IC, the power supply wiring for the amplifier and that for the main amplifier are used in common as shown in FIG. 5, and that a peripheral mounting system and the optical receiver circuit are connected by wire bonding as shown in FIG. 7. However, when the optical receiver circuit is connected with the peripheral mounting system by bonding wires, the power supply potential in the optical receiver circuit is not grounded in an alternating current (AC) manner in a high-frequency region because the impedance of the bonding wire is high in a high-frequency region. Accordingly, when the power supply wiring for the preamplifier and that for the main amplifier are used in common, high-frequency noise leak through the power supply wiring cannot be reduced.

In JP-A-2003-332855, high-frequency noise leak through the power supply wiring in an optical receiver circuit has been described. As shown in FIG. 6, an example of a technique in which a main amplifier is supplied with a power supply voltage by second power supply wiring different from first power supply wiring by which a preamplifier is supplied with the power supply voltage.

The inventors of the present application have examined techniques for achieving a broadband and high-gain optical receiver circuit prior to filing the application. An optical receiver circuit is generally connected with a peripheral mounting system by wire bonding as shown in FIG. 7. When an optical receiver circuit is connected with a peripheral mounting system by wire bonding, the power supply voltage in the optical receiver circuit is not grounded in an alternating (AC) manner in a high-frequency region because the impedance of the bonding wire is high in a high-frequency region. Accordingly, high-frequency noise, such as reflection with the subsequent-stage transmission line, etc., leaks into the preamplifier and the reference voltage generating circuit from the main amplifier, through the power supply wiring and the ground potential wiring in the optical receiver circuit, and through the substrate to which the potential of the ground potential wiring is supplied. In addition, whereas an output signal of the reference voltage generating circuit is only dependent on the ground potential in the optical receiver circuit, an output signal of the preamplifier is affected by a photodiode, etc., that is connected with the preceding-stage, and hence the output signal thereof is dependent on not only the ground potential in the optical receiver circuit but also the ground potential in an optical signal receiver. The ground impedances of the preamplifier and the reference voltage generating circuit are different from each other because the ground potential on which an output of the preamplifier is dependent and that on which an output of the reference voltage generating circuit is dependent are different. Due to the difference between the ground impedances, high-frequency noise that has leaked into the preamplifier and the reference voltage generating circuit appears as a difference between output signals of the preamplifier and the reference voltage generating circuit. The difference is then amplified by the main amplifier, the inputs of which are an output of the preamplifier and that of the reference voltage generating circuit, and a loop path is formed through which the amplified difference leaks into the power supply wiring and the ground potential wiring, thereby generating an oscillation phenomenon. The oscillation phenomenon becomes significant as the gain of the optical receiver circuit increases and as the impedance of the bonding wire connected with a power supply pad and a ground potential pad of the optical receiver circuit increases, which causes a problem, in particular, in the case of a broadband and high-gain optical receiver circuit of a gigabit order. JP-A-2003-332855 shown in FIG. 6 has disclosed a technique for reducing high-frequency noise leak through the power supply wiring in the aforementioned optical receiver circuit. However, the inventors of the present application have found that it is sometimes difficult to reduce the aforementioned oscillation phenomenon occurring due to the high-frequency noise leak through the ground potential wiring and the substrate to which the potential of the ground potential wiring is supplied.

FIG. 5 is a view showing the configuration of an optical receiver circuit 101 examined by the inventors prior to filing the present application. In the optical receiver circuit 101, an oscillation phenomenon has become a problem in which high-frequency noise leak into a preamplifier 10 and a reference voltage generating circuit 20 from a main amplifier 30 is generated through power supply wiring 50 and ground potential wiring 60 in the optical receiver circuit 101, and through a substrate to which the potential of the ground potential wiring 60 is supplied.

FIG. 7 is a schematic view showing the mounting of the whole optical signal receiver including the optical receiver circuit 101 examined prior to filing the present application.

FIG. 8 is a schematic view showing the configuration of the whole optical signal receiver including the optical receiver circuit 101 examined prior to filing the present application. A mechanism through which an oscillation phenomenon is generated will be described below. The high-frequency noise that has leaked into the preamplifier 10 and the reference voltage generating circuit 20 appears as a difference between the output signals of the preamplifier 10 and the reference voltage generating circuit 20 due to the following factors: a first factor in which high-frequency noise, such as reflection due to impedance mismatch with the subsequent-stage transmission line 300, leaks into the preamplifier 10 and the reference voltage generating circuit 20 from the main amplifier 30 through the power supply wiring 50 and the ground potential wiring 60 in the optical receiver circuit 101, and through the substrate to which the potential of the ground potential wiring 60 is supplied; and a second factor in which, whereas an output of the reference voltage generating circuit 20 is only dependent on the ground potential in the optical receiver circuit 101, an output of the preamplifier 10 is dependent on both the ground potential in an optical signal receiver and that in the optical receiver circuit 101, and hence the ground impedances of the preamplifier 10 and the reference voltage generating circuit 20 are different from each other. The difference is then amplified by the main amplifier 30, the two inputs of which are an output of the preamplifier 10 and that of the reference voltage generating circuit 20, and a loop path is formed through which the amplified difference leaks into the power supply wiring 50 and the ground potential wiring 60, thereby generating an oscillation phenomenon.

Conventionally, an optical receiver circuit is provided with a circuit to generate reference current and a current output circuit, which are used for generating a reference current of a current supply for each circuit in the optical receiver circuit. One circuit to generate reference current and one current output circuit are provided in the optical receiver circuit in order to make an influence on the reference current, occurring due to a variation in temperature, that in the power supply voltage, and a scattering in devices, equal in each circuit.

In the configuration shown in FIG. 4 of JP-T-2008-507943, an oscillation phenomenon, occurring due to high-frequency noise leak through the power supply wiring and the ground potential wiring in the optical receiver circuit and through a substrate, can be reduced by making the ground impedances of the preamplifier and the reference voltage generating circuit equal with the cathode of a photodiode connected with the ground potential wiring in the optical receiver circuit through a bypass capacitor. However, the effect of reducing the oscillation phenomenon is strongly dependent on the parasitic capacitance on the cathode side of the photodiode.

As stated above, JP-T-2008-507943 has disclosed a technique in which the cathode of a photodiode is connected with the ground potential wiring in the optical receiver circuit through a bypass capacitor to make the respective ground impedances of the preamplifier and the reference voltage generating circuit. In addition, JP-A-2002-368112 has disclosed a technique in which the input-stage transistor in a preamplifier is provided with power supply wiring that is independent from other circuit elements in an optical receiver circuit. Both the techniques disclosed in JP-T-2008-507943 and JP-A-2002-368112 are seemingly looked to be the same as the present invention in the following points: in the technique of JP-T-2008-507943, it is taken into consideration that an output of the optical receiver circuit is affected by a difference between output signals of the preamplifier and the reference voltage generating circuit, occurring due to high-frequency noise leak into the preamplifier and the reference voltage generating circuit from the main amplifier; and in the technique of JP-A-2002-368112, the input-stage transistor in the preamplifier is provided with power supply wiring that is independent from other circuit elements in the optical receiver circuit. However, each of these techniques should be clearly distinguished from the present invention because, in each of these techniques, the preamplifier, the reference voltage generating circuit, and the main amplifier are supplied with power supply voltage and ground potential by the identical power supply wiring and the identical ground potential wiring. For example, in the technique of JP-T-2008-507943, the preamplifier, the reference voltage generating circuit, and the main amplifier are supplied with power supply voltage and ground potential by the identical power supply wiring and the identical ground potential wiring. Accordingly, high-frequency noise leak into the preamplifier and the reference voltage generating circuit from the main amplifier is generated through the power supply wiring, the ground potential wiring, and the substrate to which the ground potential is supplied. Further, the respective ground impedances of the preamplifier and the reference voltage generating circuit diverge from each other as the parasitic capacitance on the cathode side of the photodiode increases, and the high-frequency noise that has leaked appears as a difference between the output signals of the preamplifier and the reference voltage generating circuit, thereby causing the problem that an oscillation phenomenon due to high-frequency noise leak is sometime generated. The technique of JP-A-2002-368112 has a configuration in which the input-stage transistor in the preamplifier is only connected with the first power supply wiring and the first ground potential wiring, and other circuit elements in the optical receiver circuit including the output-stage transistor in the preamplifier, are connected with the second power supply wiring and the second ground potential wiring, which are separated from the first power supply wiring and the first ground potential wiring. Accordingly, high-frequency noise leak into the output-stage transistor in the preamplifier and the reference voltage generating circuit from the main amplifier is generated through the power supply wiring, the ground potential wiring, and the substrate to which the ground potential is supplied. Further, because the ground impedances of the preamplifier and the reference voltage generating circuit are different from each other, the high-frequency noise that has leaked appears as a difference between the output signals of the preamplifier and reference voltage generating circuit, thereby causing the problem that an oscillation phenomenon is generated.

An exemplary embodiment of the present invention will be described as follows. That is, an optical receiver circuit according to the present invention includes: a preamplifier to receive, as an input, a current signal outputted by a photoelectric conversion circuit that receives an optical signal and converts it into a current signal, and to output a first voltage signal by converting the current signal into the voltage signal; a reference voltage generating circuit to generate and output a second voltage signal, a DC voltage used as a reference voltage in single-to-differential conversion; and a main amplifier to receive, as inputs, the first and second voltage signals and to output a voltage signal or a differential voltage signal by amplifying the differential component between the first and second voltage signals, in which the preamplifier and the reference voltage generating circuit are connected with first ground potential wiring and first power supply wiring, which are used in common, and are formed in a first region where elements are formed on a semiconductor substrate to which the potential of the first ground potential wiring is supplied, and in which the main amplifier is connected with second ground potential wiring and second power supply wiring, which are separated from the first ground potential wiring and the first power supply wiring, and is formed in a second region where elements are formed on the semiconductor substrate to which the potential of the second ground potential wiring is supplied, and in which a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

According to the present invention, it becomes possible to reduce an oscillation phenomenon that becomes a problem in the case of a broadband and high-gain optical receiver circuit.

BRIEF DESCRIPTION OF THE DRAWINGS

FIG. 4 is a schematic view showing the mounting of the whole of the optical receiver circuit 100 using the invention and the optical signal receiver including the optical receiver circuit 100;

DETAILED DESCRIPTION OF THE PREFERRED EMBODIMENTS

Figure 1:
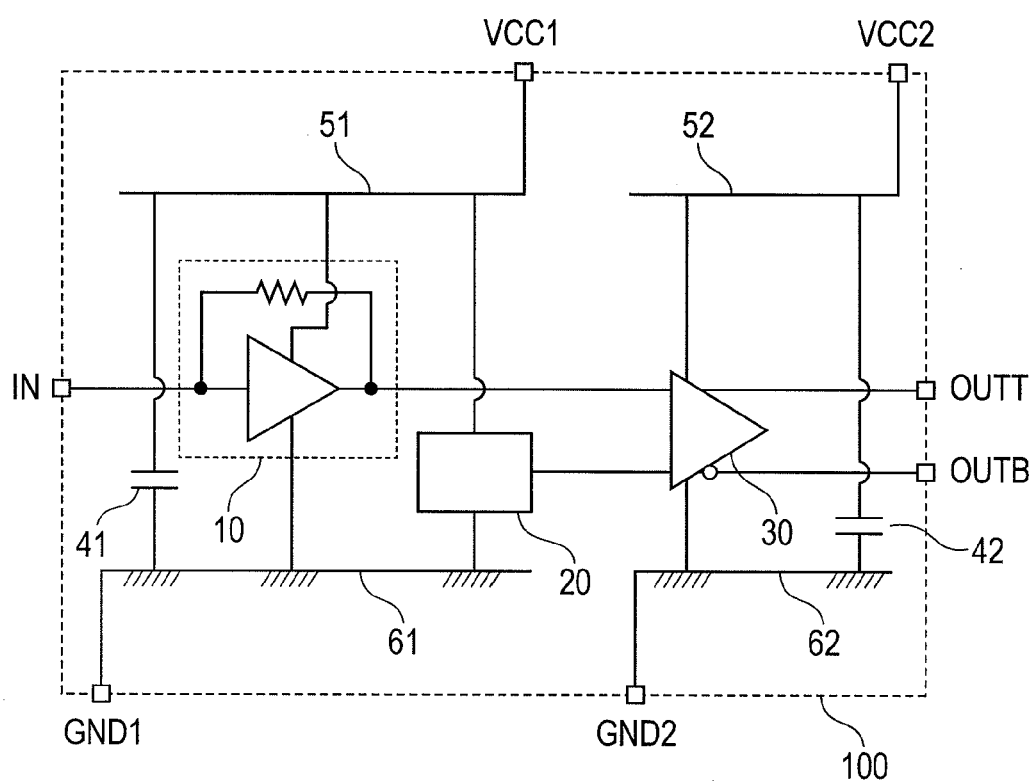
FIG. 1 is a view showing the configuration of an optical receiver circuit 100 using the present invention.

An optical receiver circuit according to the present invention includes a preamplifier, a reference voltage generating circuit, and a main amplifier. The preamplifier receives, as an input, a current signal outputted by a photoelectric conversion circuit that receives an optical signal to convert it into a current signal, and outputs a first voltage signal by converting the current signal into the voltage signal. The reference voltage generating circuit generates and outputs a second voltage signal, a DC voltage used as a reference voltage in single-to-differential conversion. The main amplifier receives, as inputs, the first and second voltage signals and outputs a voltage signal or a differential voltage signal by amplifying the differential component between the first and second voltage signals.

In an embodiment of the optical receiver circuit according to the present invention, an preamplifier and a reference voltage generating circuit are connected with first ground potential wiring and first power supply wiring, which are used in common, and are formed in a first region where elements are formed on a substrate to which the potential of the first ground potential wiring is supplied. A main amplifier is connected with second ground potential wiring and second power supply wiring, which are separated from the first ground potential wiring and the first power supply wiring, and is formed in a second region where elements are formed on the semiconductor substrate to which the potential of the second wiring is supplied. Herein, a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

It is preferable that each of the distance between the first ground potential wiring and the second ground potential wiring and that between the first power supply wiring and the second power supply wiring is, for example, equal to or longer than the substrate supply interval where the first substrate supply position and the second substrate supply position are closest to each other.

In the aforementioned embodiment of the optical receiver circuit according to the present invention, it is preferable that each of one or more pads with which the first ground potential wiring is connected, one or more pads with which the first power supply wiring is connected, one or more pads with which the second ground potential wiring is connected, and one or more pads with which the second power supply wiring is connected, is independently further comprised. In the case, the pads, each of which is independently comprised, are not connected with each other in the optical receiver circuit.

It is also preferable that a first power supply bypass capacitor, which is connected between the first ground potential wiring and the first power supply wiring and is formed in the first region where elements are formed, and a second power supply bypass capacitor different from the first power supply bypass capacitor, which is connected between the second ground potential wiring and the second power supply wiring and is formed in the second region where elements are formed, are further comprised.

It is also preferable that a first circuit to generate reference current and a first current output circuit, which are connected with the first ground potential wiring and the first power supply wiring and are formed in the first region where elements are formed, and a second circuit to generate reference current and a second current output circuit, which are connected with the second ground potential wiring and the second power supply wiring and are formed in the second region where elements are formed, are further comprised.

It is also preferable that a circuit to generate reference current and a first current output circuit, which are connected with the first ground potential wiring and the first power supply wiring and are formed in the first region where elements are formed, and a second current output circuit, which is connected with the second ground potential wiring and the second power supply wiring and is formed in the second region where elements are formed, are further comprised.

It is also preferable that a first current output circuit, which is connected with the first ground potential wiring and the first power supply wiring and is formed in the first region where elements are formed, and a circuit to generate reference current and a second current output circuit, which are connected with the second ground potential wiring and the second power supply wiring and are formed in the second region where elements are formed, are further comprised.

It is also preferable that one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals, are further comprised. In the case, it may also be possible that one complementary amplifier or more complementary amplifiers each being connected in cascade and the main amplifier are connected with power supply wiring and ground potential wiring, which are used in common, and are formed in a common region where elements are formed. Alternatively, it may also be possible that one complementary amplifier or more complementary amplifiers each being connected in cascade, the preamplifier, and the reference voltage generating circuit, are connected with power supply wiring and ground potential wiring, which are used in common, and are formed in a common region where elements are formed.

In the aforementioned embodiment of the optical receiver circuit according to the present invention, it is preferable that the cathode of a photodiode, a photoelectric conversion circuit that receives an optical signal and converts it into a current signal, is connected with the first ground potential wiring in the optical receiver circuit through a bypass capacitor and the cathode of the photodiode is connected with a power supply for photodiode through a resistor in the optical receiver circuit.

In another embodiment different from the aforementioned embodiment of the optical receiver circuit according to the present invention, a preamplifier and a reference voltage generating circuit are connected with common first ground potential wiring and are formed in a first region where elements are formed on a semiconductor substrate to which the potential of the first ground potential wiring is supplied. A main amplifier is connected with second ground potential wiring separated from the first ground potential wiring and is formed in a second region where elements are formed on the semiconductor substrate to which the potential of the second ground potential wiring is supplied. Herein, a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

It is preferable that the distance between the first ground potential wiring and the second ground potential wiring is, for example, equal to or longer than the substrate supply interval where the first substrate supply position and the second substrate supply position are closest to each other.

In the aforementioned another embodiment of the optical receiver circuit according to the present invention, it is preferable that each of one or more pads with which the first ground potential wiring is connected and one or more pads with which the second ground potential wiring is connected is independently further comprised. In the case, the pads, each of which is independently comprised, are not connected with each other in the optical receiver circuit.

It is also preferable that a first power supply bypass capacitor, which is connected with the first ground potential wiring and is formed in the first region where elements are formed, and a second power supply bypass capacitor different from the first power supply bypass capacitor, which is connected with the second ground potential wiring and is formed in the second region where elements are formed, are further comprised.

It is also preferable that a first circuit to generate reference current and a first current output circuit, which are connected with the first ground potential wiring and are formed in the first region where elements are formed, and a second circuit to generate reference current and a second current output circuit, which are connected with the second ground potential wiring and are formed in the second region where elements are formed, are further comprised.

It is also preferable that a circuit to generate reference current and a first current output circuit, which are connected with the first ground potential wiring and are formed in the first region where elements are formed, and a second current output circuit, which is connected with the second ground potential wiring and is formed in the second region where elements are formed, are further comprised.

It is also preferable that a first current output circuit, which is connected with the first ground potential wiring and is formed in the first region where elements are formed, and a circuit to generate reference current and a second current output circuit, which are connected with the second ground potential wiring and are formed in the second region where elements are formed, are further comprised.

It is also preferable that one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals, are further comprised. In the case, it may also be possible that one complementary amplifier or more complementary amplifiers each being connected in cascade and the main amplifier are connected with power supply wiring and ground potential wiring, which are used in common, and are formed in a common region where elements are formed. Alternatively, it may also be possible that one complementary amplifier or more complementary amplifiers each being connected in cascade, the preamplifier, and the reference voltage generating circuit, are connected with power supply wiring and ground potential wiring, which are used in common, and are formed in a common region where elements are formed.

In the aforementioned another embodiment of the optical receiver circuit according to the present invention, it is preferable that the cathode of a photodiode, a photoelectric conversion circuit that receives an optical signal and converts it into a current signal, is connected with the first ground potential wiring in the optical receiver circuit through a bypass capacitor and the cathode of the photodiode is connected with a power supply for photodiode through a resistor in the optical receiver circuit.

Hereinafter, embodiments of the present invention will be described with reference to accompanying drawings. Circuit elements of which each block of the embodiments is composed are not particularly limited, but are formed on a single semiconductor substrate such as monocrystalline silicon by a publicly-known IC technique. In addition, embodiments will show circuits using a bipolar transistor and an MOS transistor, but the invention according to the present application should not be limited thereto and can be applied to the circuits using ordinary semiconductors. In each element shown in the drawings, required characteristics may be achieved by connecting similar elements in parallel or series.

First Embodiment

Figure 3:
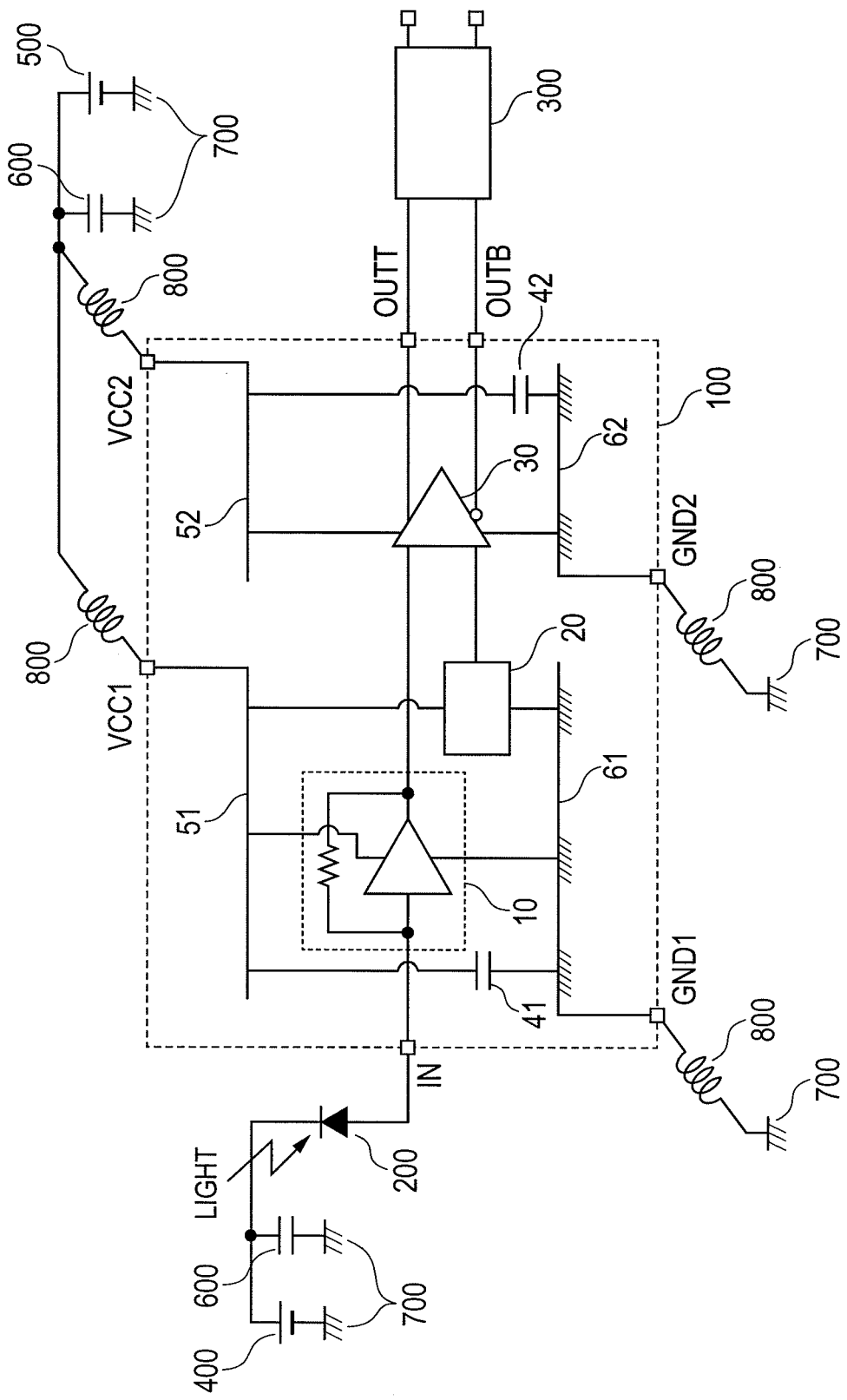
FIG. 3 is a schematic view showing the whole configuration of the optical receiver circuit 100 using the invention and an optical signal receiver including the optical receiver circuit 100.
Figure 5:
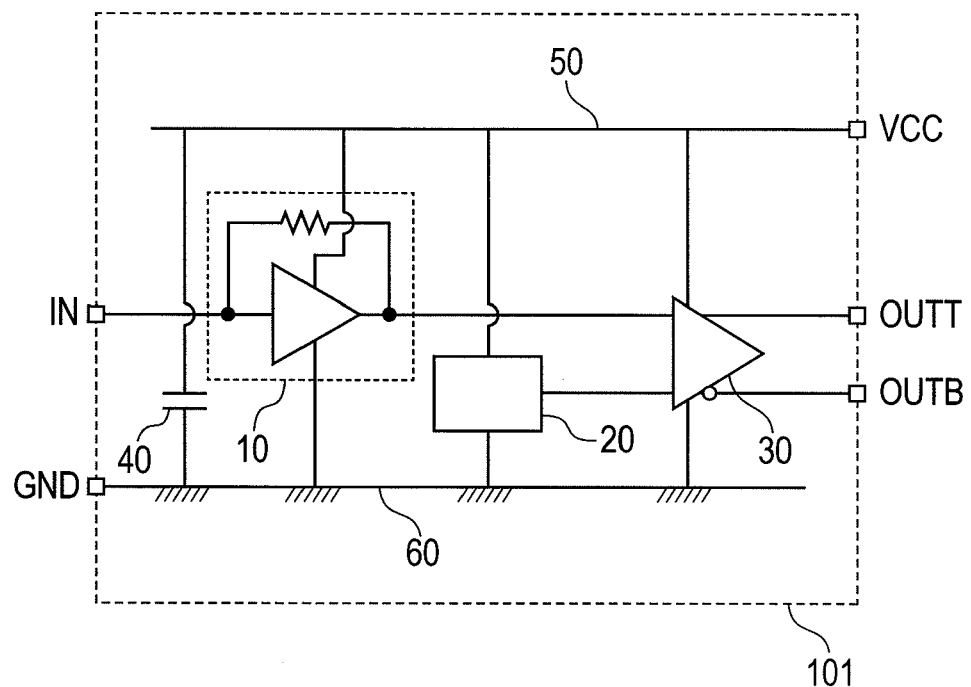
FIG. 5 is a view showing the configuration of an optical receiver circuit 101 examined prior to the invention.

FIG. 1 shows a first embodiment of the optical receiver circuit using the present invention. The optical receiver circuit 100 of the present embodiment comprises: a preamplifier 10 to receive, as an input, a current signal outputted by a photoelectric conversion circuit photodiode 200 that receives an optical signal shown in FIG. 3 and converts it into a current signal, and to convert the current signal into a voltage signal; a reference voltage generating circuit 20 to generate a DC voltage necessary for single-to-differential conversion; and a main amplifier 30 to output a differential voltage signal by amplifying the difference between the voltage signals outputted by the preamplifier 10 and the reference voltage generating circuit 20. The preamplifier 10 and the reference voltage generating circuit 20 are connected with first ground potential wiring 61 and first power supply wiring 51, which are used in common, and the main amplifier 30 is connected with second ground potential wiring 62 and second power supply wiring 52, which are separated from the first ground potential wiring 61 and the first power supply wiring 51. The optical receiver circuit 100 further includes a first power supply bypass capacitor 41, which is connected between the first ground potential wiring 61 and the first power supply wiring 51, and a second power supply bypass capacitor 42 different from the first power supply bypass capacitor 41, which is connected between the second ground potential wiring 62 and the second power supply wiring 52.

Figure 2:
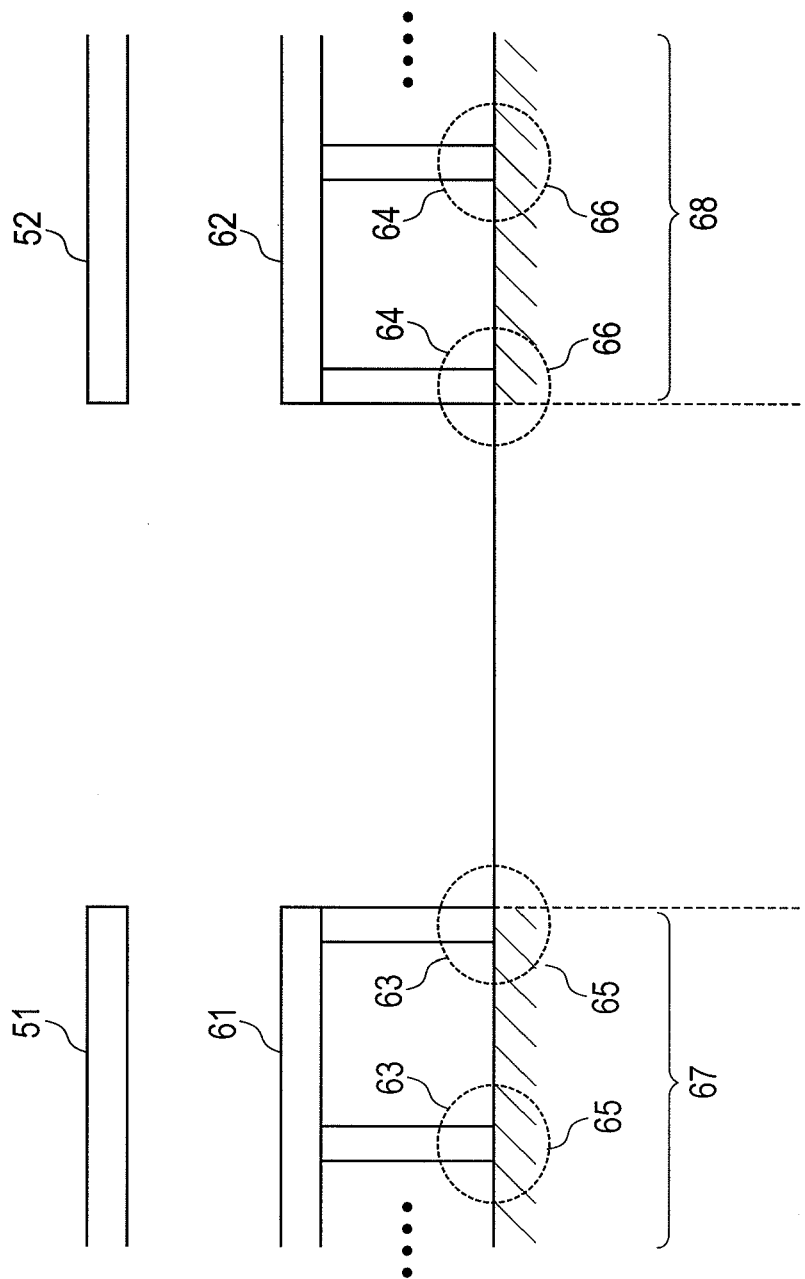
FIG. 2 is a sectional view showing a main section of the semiconductor substrate in the optical receiver circuit 100 using the invention.

FIG. 2 is a sectional view showing a main portion of a semiconductor substrate of the first embodiment. The preamplifier 10, the reference voltage generating circuit 20, and the first power supply bypass capacitor 41 are formed in a first region where elements are formed 67 on the semiconductor substrate to which the potential of the first ground potential wiring 61 is supplied by a first via 63. The main amplifier 30 and the second power supply bypass capacitor 42 are formed in a second region where elements are formed 68 on the semiconductor substrate to which the potential of the second ground potential wiring 62 is supplied by a second via 64. A substrate supply interval where a first substrate supply position 65 at which the potential of the first ground potential wiring 61 is supplied and a second substrate supply position 66 at which the potential of the second ground potential wiring 62 is supplied are closest to each other is large to an extent where a substrate permeability characteristic, in which noise is fully attenuated in an alternating current manner, is obtained. Further, each of the distance between the first ground potential wiring 61 and the second ground potential wiring 62 and that between the first power supply wiring 51 and the second power supply wiring 52 is equal to or longer than the substrate supply interval where the first substrate supply position 65 and the second substrate supply position 66 are closest to each other.

FIG. 4 is a schematic view showing the mounting of the whole of the optical receiver circuit 100 of the first embodiment and an optical signal receiver including the optical receiver circuit 100. The optical receiver circuit 100 includes each of one or more pads GND1 with which the first ground potential wiring 61 is connected, one or more pads VCC1 with which the first power supply wiring 51 is connected, one or more pads GND2 with which the second ground potential wiring 52 is connected, and one or more pads VCC2 with which the second power supply wiring 62 is connected, independently, and these pads are not connected with each other in the optical receiver circuit.

Figure 6:
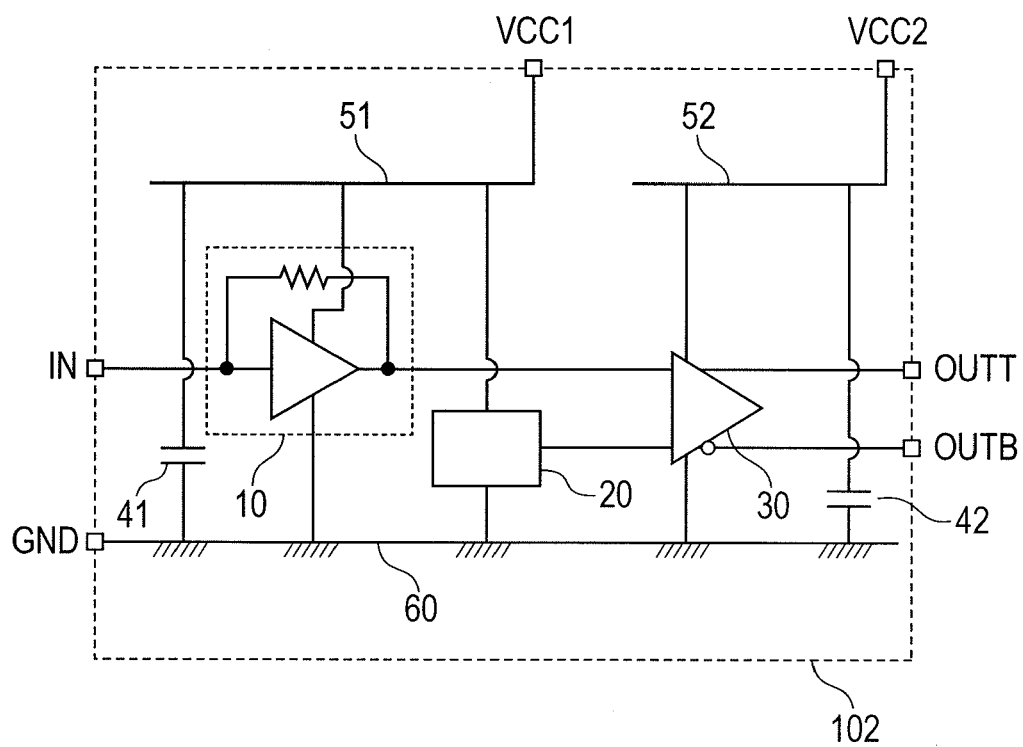
FIG. 6 is a view showing the configuration of an optical receiver circuit 102 of JP-A-2003-332855.
Figure 7:
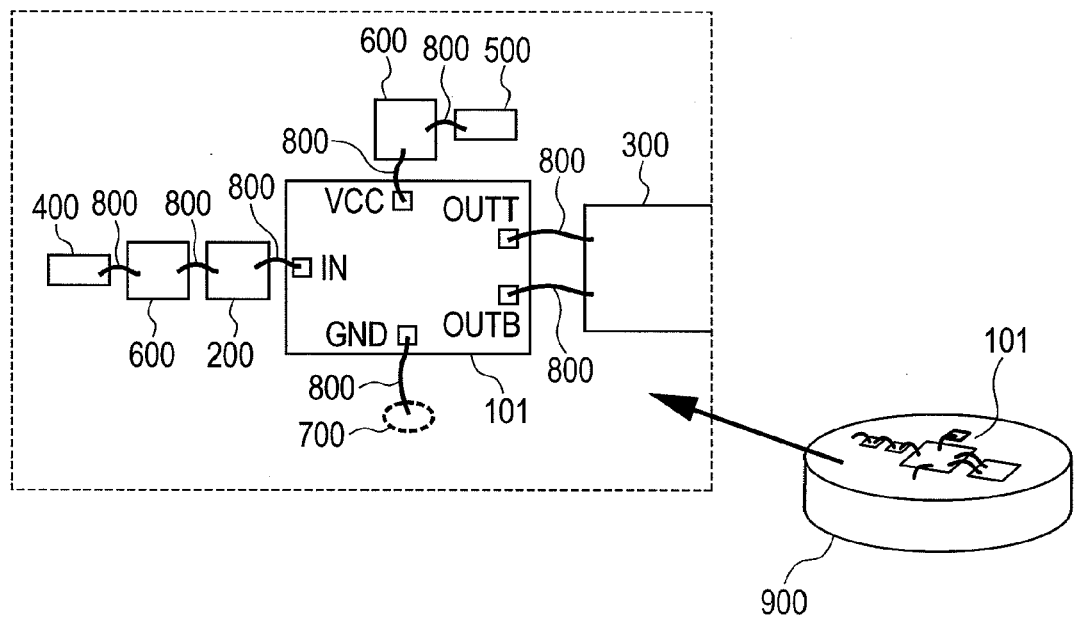
FIG. 7 is a schematic view showing the mounting of the whole of the optical receiver circuit 101 examined prior to the invention and an optical signal receiver including the optical receiver circuit 101.
Figure 8:
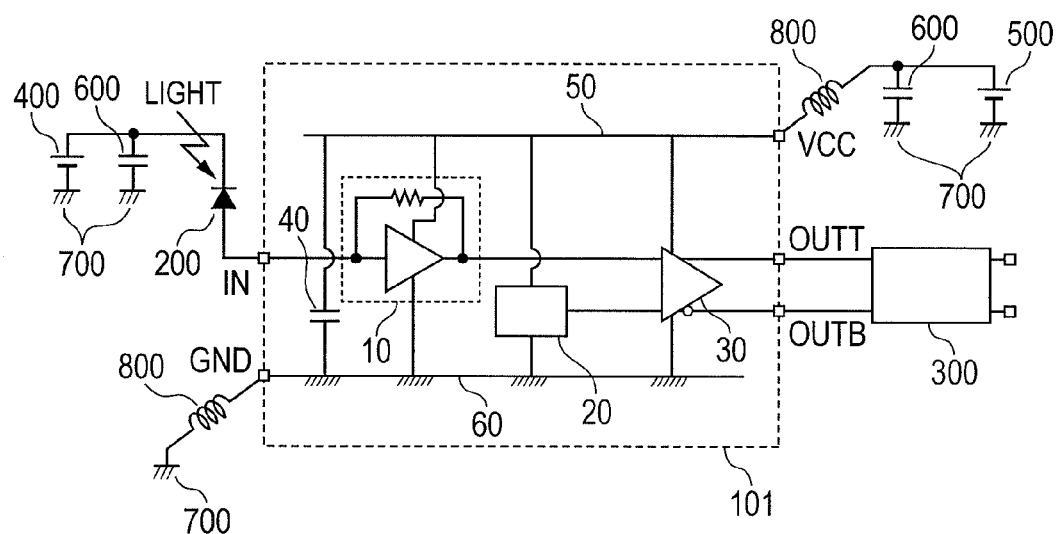
FIG. 8 is a schematic view showing the configuration of the whole of the optical receiver circuit 101 examined prior to the invention and the optical signal receiver including the optical receiver circuit 101.

The configuration according to the present embodiment is different from that of JP-A-2003-332855 shown in FIG. 6 in that: the main amplifier 30 is connected with the second ground potential wiring 62; the main amplifier 30 is formed in the second region where elements are formed; and the substrate supply interval where the first substrate supply position 65 and the second substrate supply position 66 are closest to each other is large to an extent where a substrate permeability characteristic, in which noise is fully attenuated in an alternating current manner, is obtained.

Operations of the first embodiment will be described.

In the first embodiment shown in FIG. 1, the preamplifier 10 and the reference voltage generating circuit 20 are connected with the first ground potential wiring 61 and the first power supply wiring 51, which are used in common; and the main amplifier 30 is connected with the second ground potential wiring 62 and the second power supply wiring 52, which are separated from the first ground potential wiring 61 and the first power supply wiring 51. Accordingly, even if high-frequency noise, such as reflection due to impedance mismatch with the subsequent-stage transmission line 300, enters the second power supply wiring 52 and the second ground potential wiring 62 from the main amplifier 30, leak of a signal into the preamplifier 51 and the reference voltage generating circuit 20 can be prevented.

Further, even if high-frequency noise leaks into the preamplifier and the reference voltage generating circuit from the main amplifier is generated through the substrate to which the potential of the ground potential wiring is supplied, the high-frequency noise that has entered the substrate is fully attenuated because the substrate supply interval where the first substrate supply position 65 at which the potential of the first ground potential wiring 61 is supplied and the second substrate supply position 66 at which the potential of the second ground potential wiring 62 is supplied are closest to each other is large to an extent where a substrate permeability characteristic, in which noise is fully attenuated in an alternating current manner, is obtained, as shown in FIG. 2. Thereby, high-frequency noise leak into the preamplifier 10 and the reference voltage generating circuit 20 can be prevented.

In the optical receiver circuit 100 of the present embodiment, an oscillation phenomenon can be reduced by preventing high-frequency noise leak through the power supply wiring, the ground potential wiring, and the substrate.

Figure 9:
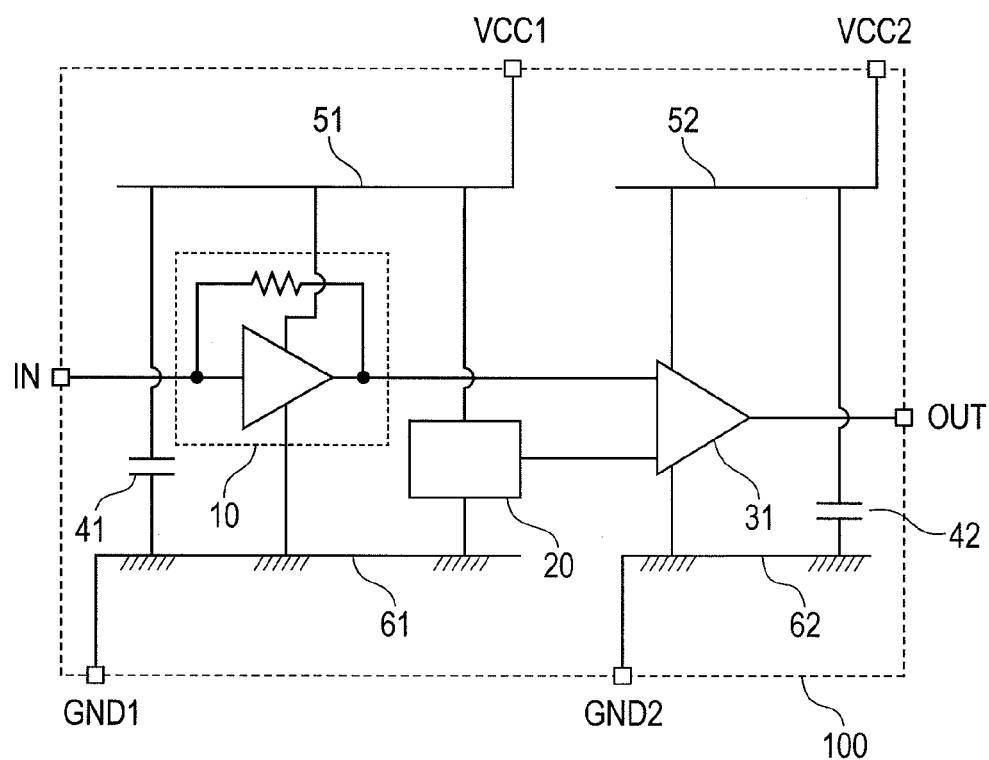
FIG. 9 is a view showing the configuration of the optical receiver circuit 100 according to an embodiment of the invention.

In the present embodiment, it is not essential that the main amplifier 30 is a differential input, differential output amplifier, but may be replaced with a differential input, single output main amplifier 31, as shown in FIG. 9. By replacing with the main amplifier 31, the optical receiver circuit 100 of the present embodiment can be used in an optical signal receiver in which an optical receiver circuit with a single-output is required.

Second Embodiment

Figure 10:
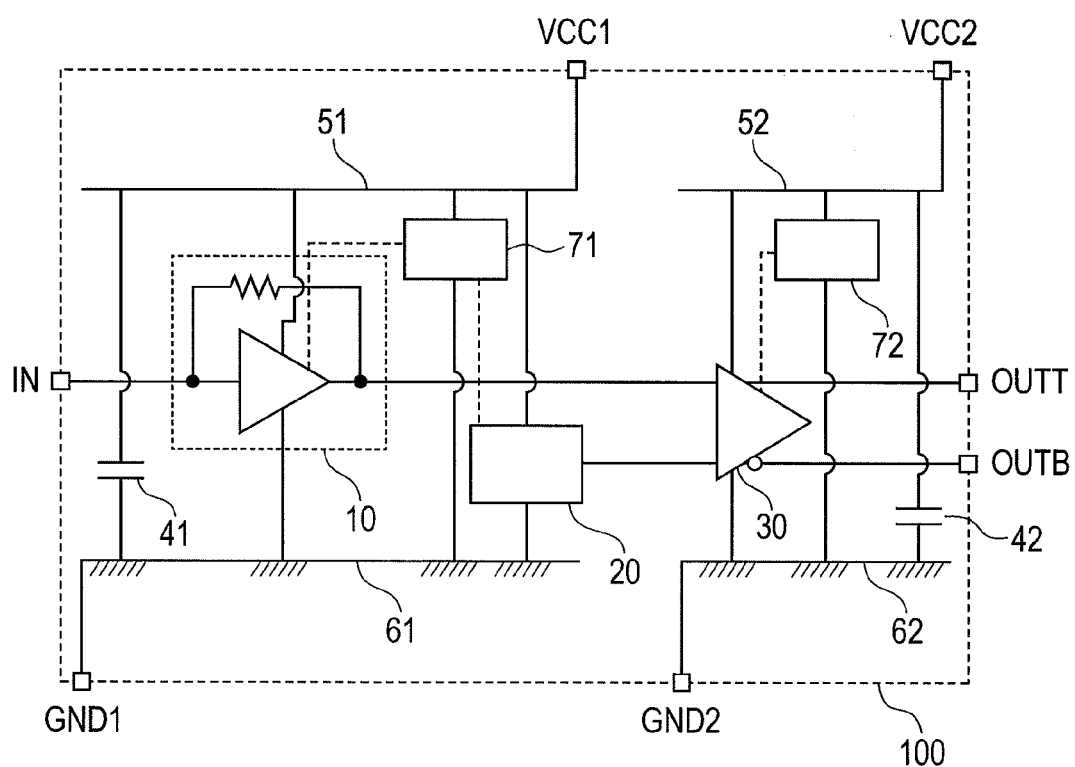
FIG. 10 is a view showing the configuration of the optical receiver circuit 100 according to an embodiment of the invention.

FIG. 10 shows a second embodiment of the optical receiver circuit using the present invention. The present embodiment is different from the first embodiment in that: whereas the optical receiver circuit 100 of the first embodiment is provided with one circuit to generate reference current and one current output circuit 70, the optical receiver circuit 100 of the present embodiment shown in FIG. 10 is provided with a first circuit to generate reference current and a first current output circuit 71, which are connected with the first ground potential wiring 61 and the first power supply wiring 51 and are formed in the first region where elements are formed 67 shown in FIG. 2, and a second circuit to generate reference current and a second current output circuit 72, which are connected with the second ground potential wiring 62 and the second power supply wiring 52 and are formed in the second region where elements are formed 68 shown in FIG. 2. The first circuit to generate reference current and the first current output circuit 71 have a function of generating and outputting a reference current to the preamplifier 10, the reference voltage generating circuit 20, and other circuits that are connected with the first power supply wiring 51 and the first ground potential wiring 61 and are formed in the first region where elements are formed 67. The second circuit to generate reference current and the second current output circuit 72 have a function of generating and outputting a reference current to the main amplifier 30 and other circuits that are connected with the second power supply wiring 52 and the second ground potential wiring 62 and are formed in the second region where elements are formed 68.

Operations of the second embodiment will be described.

Figure 11:
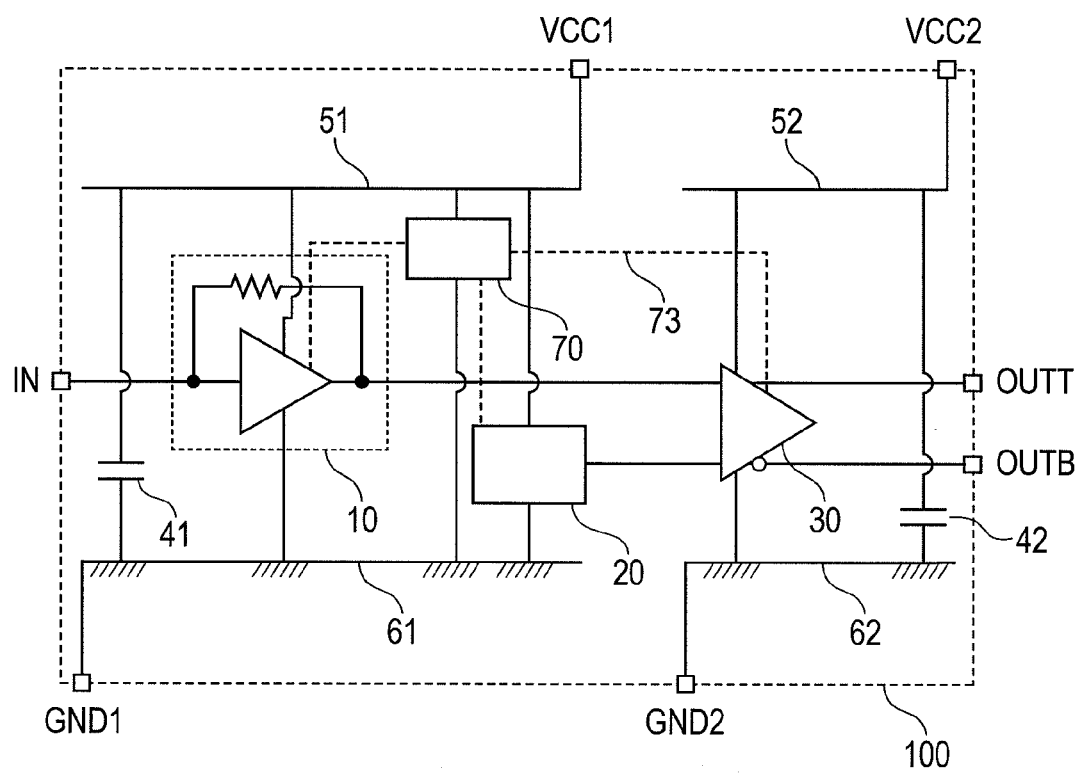
FIG. 11 is a view showing the configuration of the optical receiver circuit 100 examined prior to the invention to compare with the configuration of FIG. 10.

In the configuration of the first embodiment shown in FIG. 1, even if the optical receiver circuit 100 only includes one circuit to generate reference current and one current output circuit 70, the preamplifier 10 and the reference voltage generating circuit 20 are connected with the first ground potential wiring 61 and the first power supply wiring 51, which are used in common, and the main amplifier 30 is connected with the second ground potential wiring 62 and the second power supply wiring 52, which are separated from the first ground potential wiring 61 and the first power supply wiring 51, as stated above. Accordingly, even if high-frequency noise, such as reflection due to impedance mismatch with the subsequent-stage transmission line 300, enters the second power supply wiring 52 and the second ground potential wiring 62 from the main amplifier 30, leak of a single into the preamplifier 51 and the reference voltage generating circuit 20 can be prevented. However, when a reference current is outputted to the preamplifier 10, the reference voltage generating circuit 20, and the main amplifier 30, with one circuit to generate reference current and one current output circuit 70 provided as shown in FIG. 11, high-frequency noise, occurring due to reflection with the subsequent-stage transmission line, leaks into the preamplifier 10 and the reference voltage generating circuit 20 through: a current distribution wiring 73 by which the circuit to generate reference current, the current output circuit 70, and the main amplifier 30 are connected; the circuit to generate reference current and the current output circuit 70; and the first power supply wiring 51, the first ground potential wiring 61, and the substrate to which the potential of the first ground potential wiring 61 is supplied. Thereby, an oscillation phenomenon is generated. Even if the circuit to generate reference current and the current output circuit 70 are connected with the second power supply wiring 52 and the second ground potential wiring 62 and are formed in the second region where elements are formed 68, a similar oscillation phenomenon is generated.

In contrast, in the configuration shown in FIG. 10, because a reference current is outputted to the main amplifier 30 by the second circuit to generate reference current and the second current output circuit 72, which are independent from the first circuit to generate reference current and the first current output circuit 71, a path from the main amplifier 30 to the first circuit to generate reference current and the first current output circuit 71 does not exist, thereby allowing the aforementioned high-frequency noise leak to be prevented.

In the optical receiver circuit 100 of the present embodiment, an oscillation phenomenon can be reduced by preventing the aforementioned high-frequency noise leak through the current distribution wiring.

Third Embodiment

Figure 12:
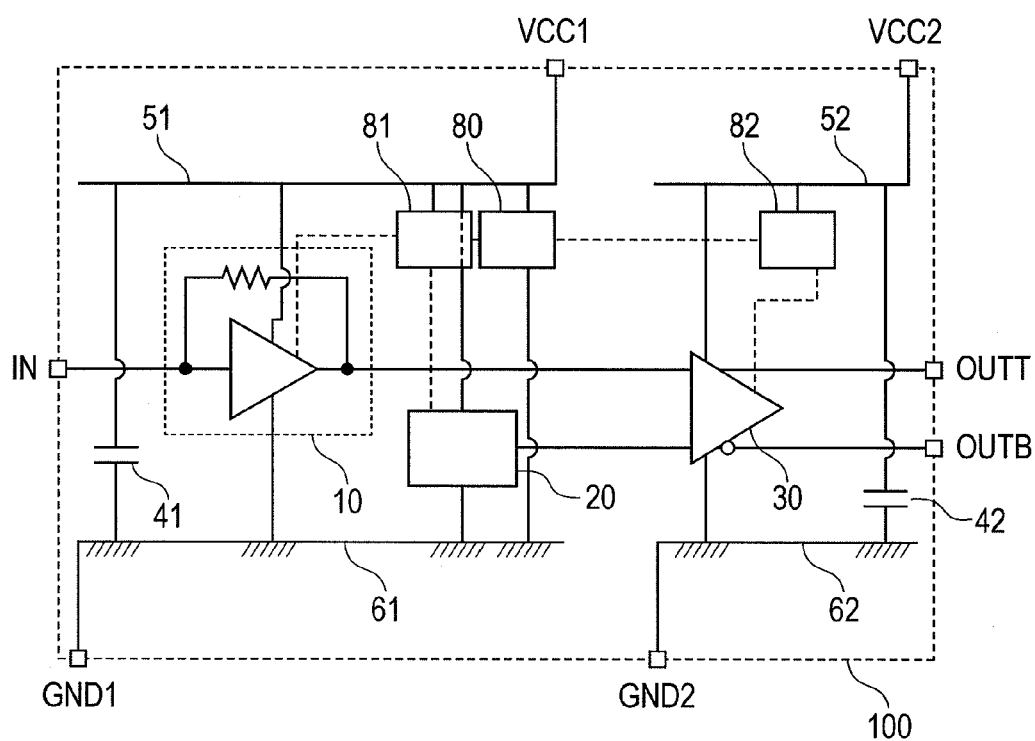
FIG. 12 is a view showing the configuration of the optical receiver circuit 100 according to an embodiment of the invention.

FIG. 12 shows a third embodiment of the optical receiver circuit using the present invention. The present embodiment is different from the second embodiment in that a second current output circuit 82 is only connected with the second power supply wiring and the second ground potential wiring and is formed in the second region where elements are formed 68. A circuit to generate reference current 80 and a first current output circuit 81 are connected with the first power supply wiring 51 and the first ground potential wiring 61 and are formed in the first region where elements are formed 67. The first current output circuit 81 has a function of outputting a reference current to the preamplifier 10, the reference voltage generating circuit 20, and other circuits that are connected with the first power supply wiring 51 and the first ground potential wiring 61 and are formed in the first region where elements are formed 67. The second current output circuit 82 has a function of outputting a reference current to the main amplifier 30 and other circuits that are connected with the second power supply wiring 52 and the second ground potential wiring 62 and are formed in the second region where elements are formed 68.

Operations of the third embodiment will be described.

Figure 15:
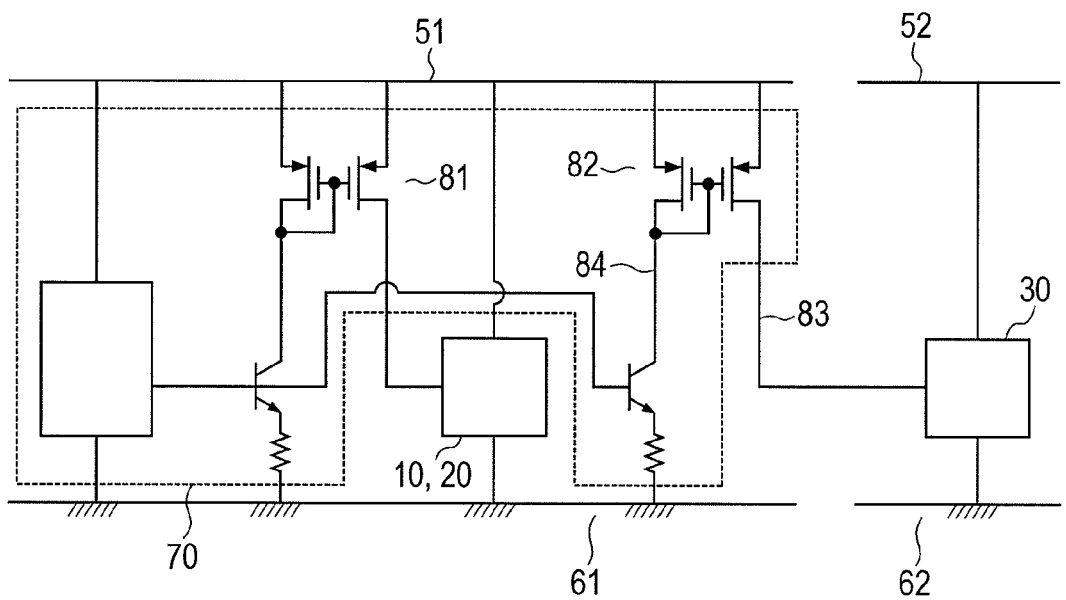
FIG. 15 is a view showing the configuration of a circuit to generate reference current and a current output circuit 70 in the optical receiver circuit 100 shown in FIG. 11.

FIG. 15 is a view showing the configuration of the circuit to generate reference current and the current output circuit 70, which are shown in FIG. 11, and current distribution wiring connecting each circuit. In the case of the configuration shown in FIG. 15, because the current distribution wiring 83 by which the circuit to generate reference current, the current output circuit 70, and the main amplifier 30 are connected is long-distance wiring, the main amplifier 30 being connected with power supply wiring and ground potential wiring, which are different from those for the circuit to generate reference current and the current output circuit 70, the parasitic capacitance between the current distribution wiring 83 and each of: each power supply wiring, each ground potential wiring, and the substrate to which each ground potential is supplied, becomes large. Accordingly, the high-frequency noise that has entered, from the main amplifier 30, the second ground potential wiring 62, the second power supply wiring 52, and the substrate to which the potential of the second ground potential wiring 62 is supplied, leaks into the current distribution wiring 83 through the parasitic capacitance between the current distribution wiring 83 and each of the second power supply wiring 52, the second ground potential wiring 62, and the substrate to which the potential of the second ground potential wiring 62 is supplied. And then, the high-frequency noise leaks into the first ground potential wiring 61, the first power supply wiring 51, and the substrate to which the first ground potential is supplied through the parasitic capacitance between the current distribution wiring 83 and each of the power supply wiring 51, the first ground potential wiring 61, and the substrate to which the first ground potential is supplied.

Figure 14:
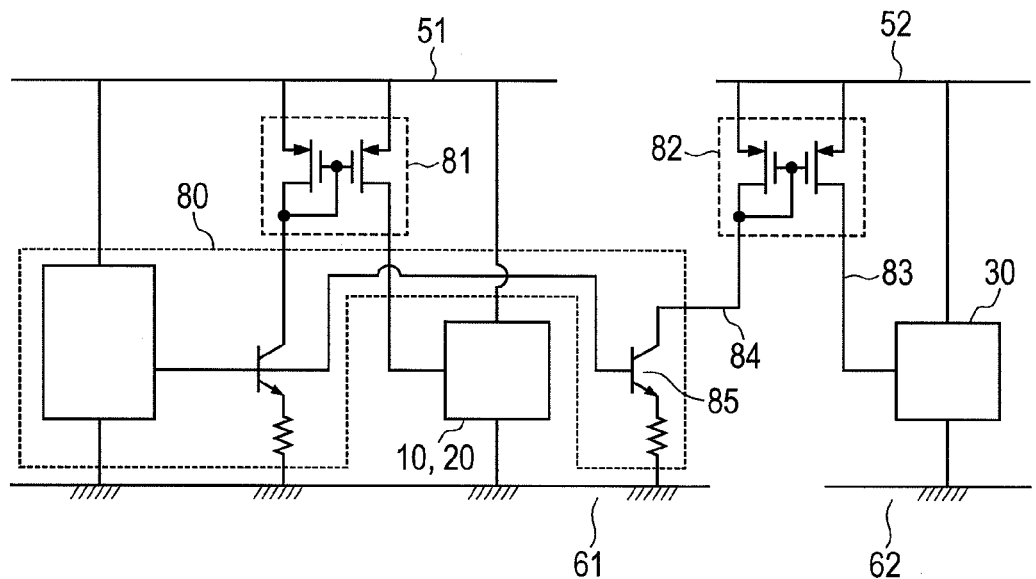
FIG. 14 is a view showing the configuration of a circuit to generate reference current 80, a first current output circuit 81, and a second current output circuit 82 in the optical receiver circuit 100 shown in FIG. 12.

FIG. 14 is a view showing the configuration of the circuit to generate reference current 80, the first current output circuit 81, the second current output circuit 82, and the current distribution wiring connecting each circuit according to the present embodiment (FIG. 12). In the case of the configuration shown in FIG. 14, because the current distribution wiring 84 is wiring connecting a reference current generating bipolar transistor 85 and the second current output circuit 82, the current distribution wiring 84 becomes shorter-distance wiring than the current distribution wiring 83 in FIG. 15, thereby allowing the parasitic capacitance with each power supply wiring, each ground potential wiring, and the substrate to which each ground potential is supplied, to be made smaller than that in the configuration shown in FIG. 15. Accordingly, leak of the high-frequency noise that has entered, from the main amplifier 30, the second ground potential wiring 62, the second power supply wiring 52, and the substrate to which the second ground potential is supplied, through the parasitic capacitance of the current distribution wiring 84, can be prevented.

In the optical receiver circuit 100 of the present embodiment, an oscillation phenomenon can be reduced by preventing the aforementioned high-frequency noise leak through the substrate and the current distribution wiring.

Further, because one circuit to generate reference current is sufficient in the present embodiment, there is a significant advantage in terms of allowing the optical receiver circuit to be small in size. Furthermore, because reference currents for the first current output circuit 81 and the second reference current output circuit 82 are generated by a single circuit to generate reference current 80 in the present embodiment, there is a significant advantage in terms of allowing influence on the reference current due to a scattering in devices to be made equal.

Figure 13:
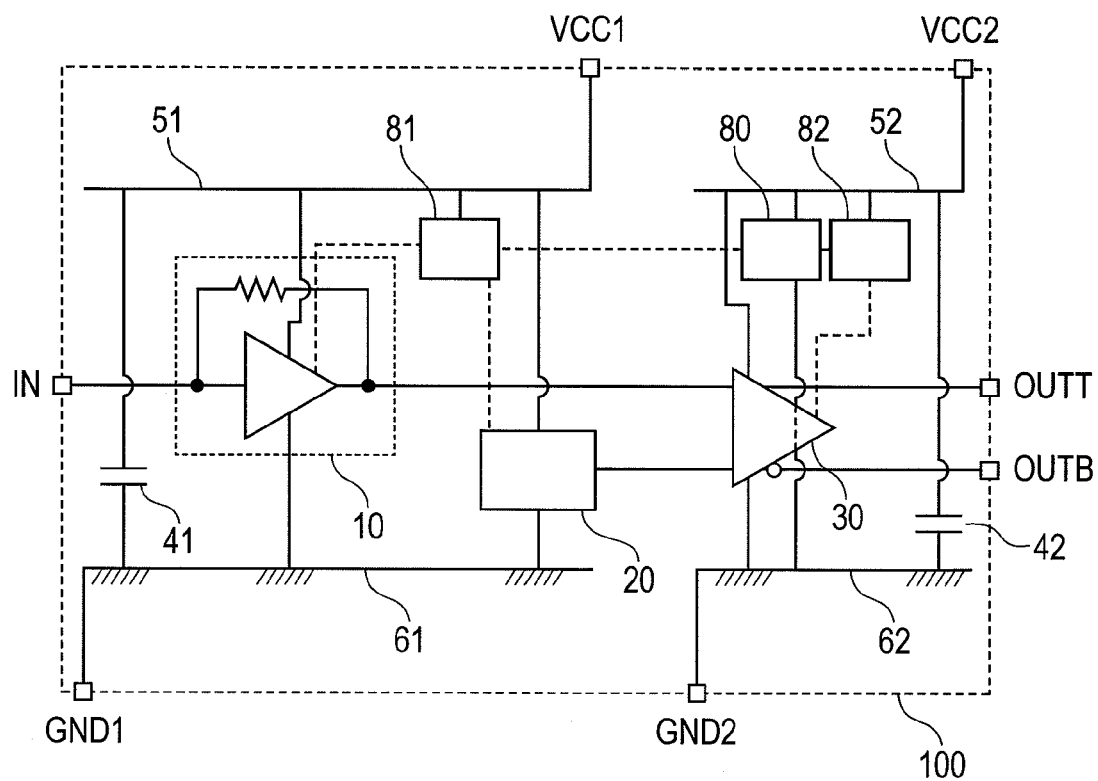
FIG. 13 is a view showing the configuration of the optical receiver circuit 100 according to an embodiment of the invention.

In the present embodiment, it is not essential that the circuit to generate reference current 80 is connected with the first power supply wiring 51 and the first ground potential wiring 61 and is formed in the first region where elements are formed 67, but it may also be possible that the circuit to generate reference current 80 is connected with the second power supply wiring 52 and the second ground potential wiring 62 and is formed in the second region where elements are formed 68, as shown in FIG. 13. By permitting the arrangement of the circuit to generate reference current 80 to be selected, a degree of selection of the design can be widened, for example, an optimal configuration can be selected in terms of layout.

Fourth Embodiment

Figure 16:
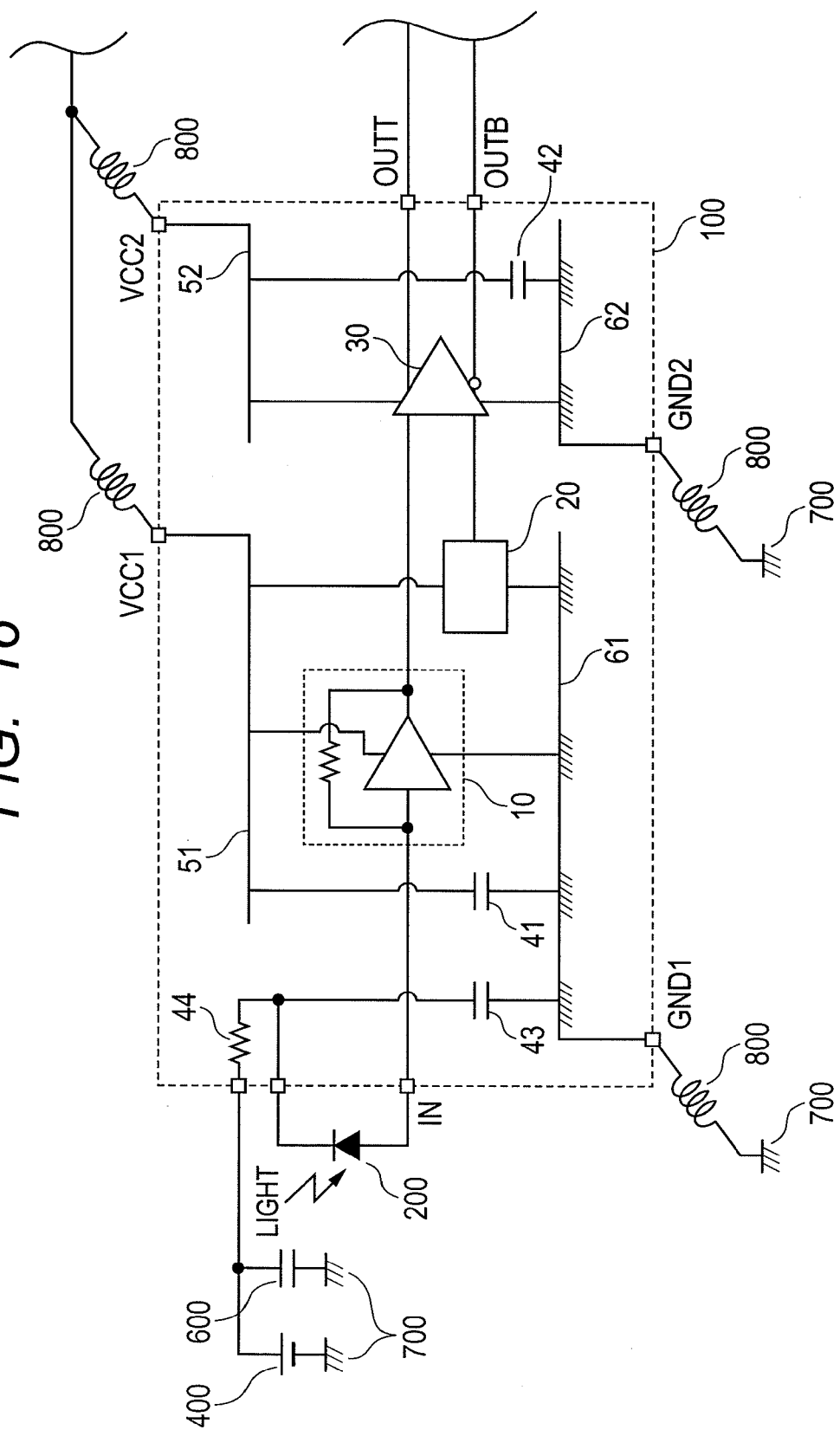
FIG. 16 is a schematic view showing the configuration of the whole of the optical receiver circuit 100 according to an embodiment of the invention and the optical signal receiver including the optical receiver circuit 100.

FIG. 16 shows a fourth embodiment of the optical receiver circuit using the present invention. The present embodiment is different from the first embodiment in that the cathode of the photodiode 200 is connected with the first ground potential wiring 61 in the optical receiver circuit 100 through the bypass capacitor 43, as shown in JP-T-2008-507943, and the cathode of the photodiode 200 is connected with a power supply 400 for photodiode through a resistor 44 in the optical receiver circuit.

Operations of the fourth embodiment will be described.

In the present embodiment shown in FIG. 16, high-frequency noise leak through the power supply wiring and the ground potential wiring in the optical receiver circuit, and through the substrate is prevented as shown in the first embodiment, and the ground impedances of the preamplifier 10 and the reference voltage generating circuit 20 are made equal to each other by connecting the cathode of the photodiode with the first ground potential wiring 61 in the optical receiver circuit through the bypass capacitor 43. Thereby, a large effect of reducing an oscillation phenomenon can be achieved, while the dependency of the effect of reducing an oscillation phenomenon on the parasitic capacitance on the cathode side of the photodiode 200 is being made small.

Fifth Embodiment

Figure 17:
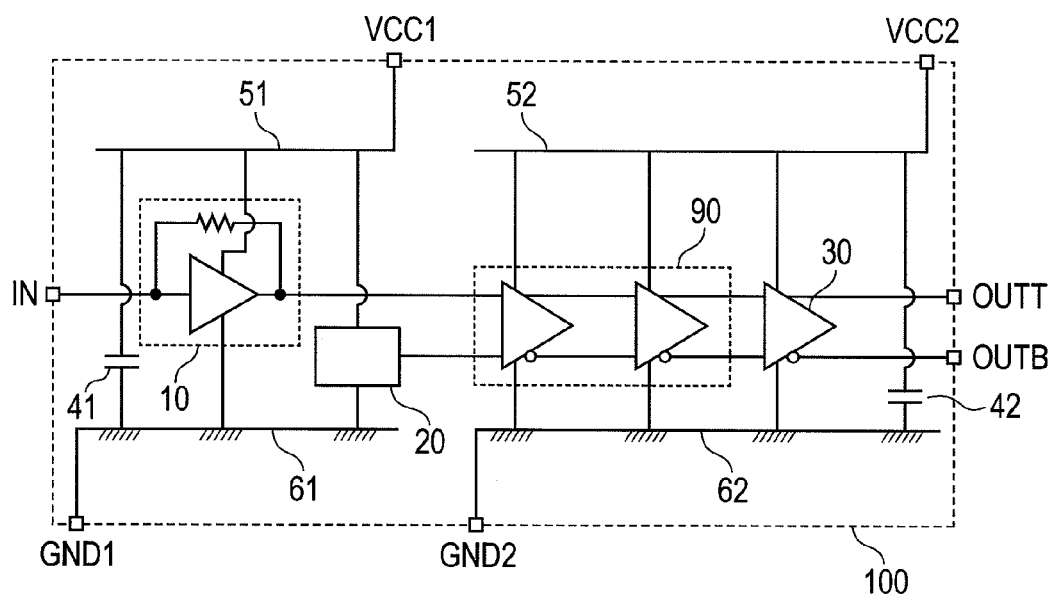
FIG. 17 is a view showing the configuration of the optical receiver circuit 100 according to an embodiment of the invention.

FIG. 17 shows a fifth embodiment of the optical receiver circuit using the present invention. The present embodiment is different from the first embodiment in that: there are provided two complementary amplifiers 90 each being connected in cascade, receiving, as inputs, a first voltage signal outputted by the preamplifier 10 and a second voltage signal outputted by the reference voltage generating circuit 20 and outputting a differential voltage signal by amplifying the differential component between the first and second voltage signals, and the two complementary amplifiers 90 are connected with the second power supply wiring 52 and the second ground potential wiring 62 and are formed in the second region where elements are formed.

Operations of the fifth embodiment will be described.

By providing the complementary amplifiers 90, a gain higher than the first embodiment can be achieved, while an oscillation phenomenon, occurring due to high-frequency noise leak through the power supply wiring and the ground potential wiring in the optical receiver circuit and through the substrate, is being reduced in the same way as the first embodiment.

In the present embodiment, it is not essential that there are provided two complementary amplifiers 90, but it may also be possible that there is provided one complementary amplifier 90 or there are provided three or more complementary amplifiers 90.

Figure 18:
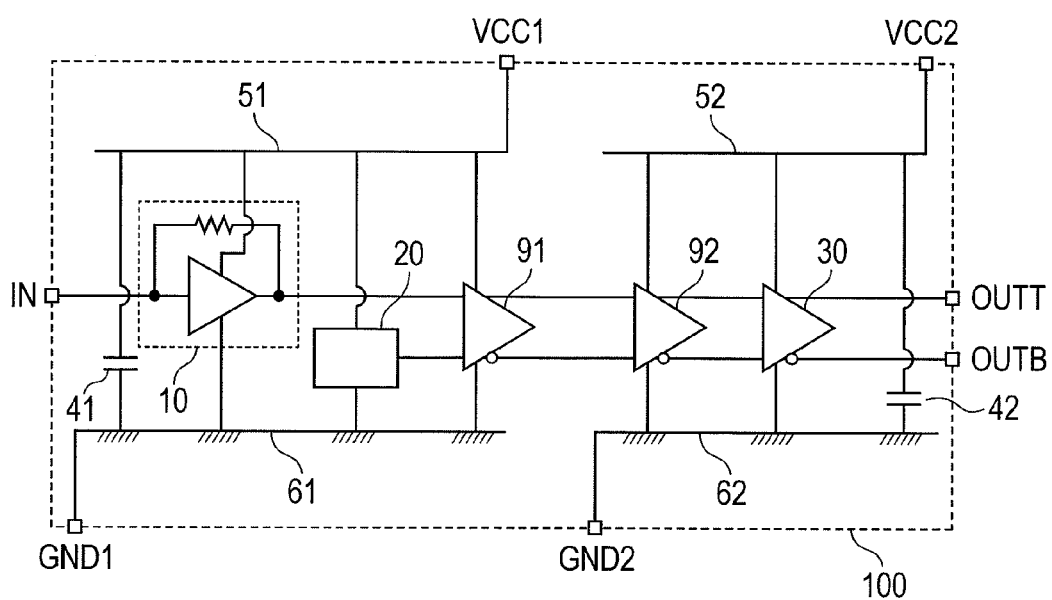
FIG. 18 is a view showing the configuration of the optical receiver circuit 100 according to an embodiment of the invention.
Figure 19:
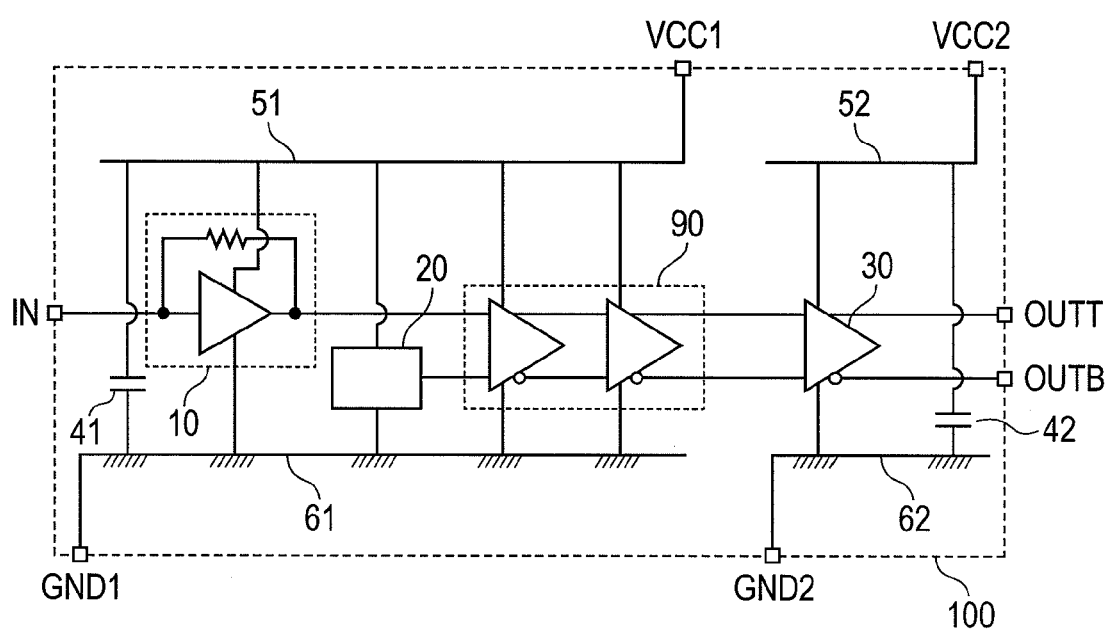
FIG. 19 is a view showing the configuration of the optical receiver circuit 100 according to an embodiment of the invention.

In addition, in the present embodiment, it is not essential that the two complementary amplifiers 90 are connected with the second power supply wiring 52 and the second ground potential wiring 62 and are formed in the second region where elements are formed 68, but it may also be possible that a first complementary amplifier 91, connected with the subsequent-stage of the preamplifier 10 and the reference voltage generating circuit 20, is connected with the first power supply wiring 51 and the first ground potential wiring 61 and is formed in the first region where elements are formed 67; and a second complementary amplifier 92, connected with the preceding-stage of the main amplifier 30, is connected with the second power supply wiring 52 and the second ground potential wiring 62 and is formed in the second region where elements are formed 68, as shown in FIG. 18. Alternatively, it may also be possible that the two complementary amplifiers 90 are connected with the first power supply wiring 51 and the first ground potential wiring 61 and are formed in the first region where elements are formed 67 as shown in FIG. 19. By permitting the arrangement of the multiple complementary amplifiers 90 to be arbitrarily selected, a degree of selection of the design can be widened, for example, an optimal configuration can be selected in terms of layout.

What is claimed is:

1. An optical receiver circuit comprising:
a preamplifier to receive, as an input, a current signal outputted by a photoelectric conversion circuit that receives an optical signal and converts the optical signal into a current signal, and to output a first voltage signal by converting the current signal into the voltage signal;
a reference voltage generating circuit to generate and output a second voltage signal, a direct current voltage used as a reference voltage in single-to-differential conversion; and
a main amplifier to receive, as inputs, the first and second voltage signals and to output a voltage signal or a differential voltage signal by amplifying the differential component between the first and second voltage signals,
wherein the preamplifier and the reference voltage generating circuit are connected with a first ground potential wiring and a first power supply wiring, which are used in common, and are formed in a first region where elements are formed on a semiconductor substrate to which the potential of the first ground potential wiring is supplied,
wherein the main amplifier is connected with a second ground potential wiring and a second power supply wiring, which are separated from the first ground potential wiring and the first power supply wiring, and is formed in a second region where elements are formed on the semiconductor substrate to which the potential of the second ground potential wiring is supplied, and
wherein a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

2. The optical receiver circuit according to claim 1, wherein each of the distance between the first ground potential wiring and the second ground potential wiring and that between the first power supply wiring and the second power supply wiring is equal to or longer than the substrate supply interval where the first substrate supply position and the second substrate supply position are closest to each other.

3. The optical receiver circuit according to claim 1, further comprising:
one or more pads with which the first ground potential wiring is connected;
one or more pads with which the first power supply wiring is connected;
one or more pads with which the second ground potential wiring is connected; and
one or more pads with which the second power supply wiring is connected,
wherein the pads each being independently comprised are not connected with each other in the optical receiver circuit.

4. The optical receiver circuit according to claim 1, further comprising:
a first power supply bypass capacitor, which is connected between the first ground potential wiring and the first power supply wiring and is formed in the first region where elements are formed; and
a second power supply bypass capacitor different from the first power supply bypass capacitor, which is connected between the second ground potential wiring and the second power supply wiring and is formed in the second region where elements are formed.

5. The optical receiver circuit according to claim 1, further comprising:
a first circuit to generate reference current and a first current output circuit, which are connected with the first ground potential wiring and the first power supply wiring and are formed in the first region where elements are formed; and
a second circuit to generate reference current and a second current output circuit, which are connected with the second ground potential wiring and the second power supply wiring and are formed in the second region where elements are formed.

6. The optical receiver circuit according to claim 1, further comprising:
a circuit to generate reference current and a first current output circuit, which are connected with the first ground potential wiring and the first power supply wiring and are formed in the first region where elements are formed; and
a second current output circuit, which is connected with the second ground potential wiring and the second power supply wiring and is formed in the second region where elements are formed.

7. The optical receiver circuit according to claim 1, further comprising:
a first current output circuit, which is connected with the first ground potential wiring and the first power supply wiring and is formed in the first region where elements are formed; and
a circuit to generate reference current and a second current output circuit, which are connected with the second ground potential wiring and the second power supply wiring and are formed in the second region where elements are formed.

8. The optical receiver circuit according to claim 1, further comprising:
one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals, wherein one complementary amplifier or more complementary amplifiers each being connected in cascade and the main amplifier are connected with power supply wiring and ground potential wiring, which are used in common, and are formed in a common region where elements are formed.

9. The optical receiver circuit according to claim 1, further comprising:
one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals,
wherein one complementary amplifier or more complementary amplifiers each being connected in cascade, the preamplifier, and the reference voltage generating circuit, are connected with power supply wiring and ground potential wiring, which are used in common, and are formed in a common region where elements are formed.

10. The optical receiver circuit according to claim 1,
wherein the cathode of a photodiode, a photoelectric conversion circuit that receives an optical signal and converts the optical signal into a current signal, is connected with the first ground potential wiring in the optical receiver circuit through a bypass capacitor, and
wherein the cathode of the photodiode is connected with a power supply for photodiode through a resistor in the optical receiver circuit.

11. An optical receiver circuit comprising:
a preamplifier to receive, as an input, a current signal outputted by a photoelectric conversion circuit that receives an optical signal and converts the optical signal into a current signal, and to output a first voltage signal by converting the current signal into the voltage signal;
a reference voltage generating circuit to generate and output a second voltage signal, a direct current voltage used as a reference voltage in single-to-differential conversion; and
a main amplifier to receive, as inputs, the first and second voltage signals and to output a voltage signal or a differential voltage signal by amplifying the differential component between the first and second voltage signals,
wherein the preamplifier and the reference voltage generating circuit are connected with common first ground potential wiring and are formed in a first region where elements are formed on a semiconductor substrate to which the potential of the first ground potential wiring is supplied,
wherein the main amplifier is connected with second ground potential wiring separated from the first ground potential wiring and is formed in a second region where elements are formed on the semiconductor substrate to which the potential of the second ground potential wiring is supplied, and
wherein a substrate supply interval where a first substrate supply position at which the potential of the first ground potential wiring is supplied and a second substrate supply position at which the potential of the second ground potential wiring is supplied are closest to each other is large to an extent where a substrate permeability characteristic, in which noise is fully attenuated in an alternating current (AC) manner, is obtained.

12. The optical receiver circuit according to claim 11, wherein the distance between the first ground potential wiring and the second ground potential wiring is equal to or longer than the substrate supply interval where the first substrate supply position and the second substrate supply position are closest to each other.

13. The optical receiver circuit according to claim 11, further comprising:
one or more pads with which the first ground potential wiring is connected; and
one or more pads with which the second ground potential wiring is connected,
wherein the pads each being independently comprised are not connected with each other in the optical receiver circuit.

14. The optical receiver circuit according to claim 11, further comprising:
a first power supply bypass capacitor, which is connected with the first ground potential wiring and is formed in the first region where elements are formed; and
a second power supply bypass capacitor different from the first power supply bypass capacitor, which is connected with the second ground potential wiring and is formed in the second region where elements are formed.

15. The optical receiver circuit according to claim 11, further comprising:
a first circuit to generate reference current and a first current output circuit, which are connected with the first ground potential wiring and are formed in the first region where elements are formed; and
a second circuit to generate reference current and a second current output circuit, which are connected with the second ground potential wiring and are formed in the second region where elements are formed.

16. The optical receiver circuit according to claim 11, further comprising:
a circuit to generate reference current and a first current output circuit, which are connected with the first ground potential wiring and are formed in the first region where elements are formed; and
a second current output circuit, which is connected with the second ground potential wiring and is formed in the second region where elements are formed.

17. The optical receiver circuit according to claim 11, further comprising:
a first current output circuit, which is connected with the first ground potential wiring and is formed in the first region where elements are formed; and
a circuit to generate reference current and a second current output circuit, which are connected with the second ground potential wiring and are formed in the second region where elements are formed.

18. The optical receiver circuit according to claim 11, further comprising:
one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals,
wherein one complementary amplifier or more complementary amplifiers each being connected in cascade and the main amplifier are connected with power supply wiring and ground potential wiring, which are used in common, and are formed in a common region where elements are formed.

19. The optical receiver circuit according to claim 11, further comprising:

one or more complementary amplifiers each being connected in cascade, which receive, as inputs, a first voltage signal outputted by the preamplifier and a second voltage signal outputted by the reference voltage generating circuit and output a differential voltage signal to the main amplifier by amplifying the differential component between the first and second voltage signals, wherein one complementary amplifier or more complementary amplifiers each being connected in cascade, the preamplifier, and the reference voltage generating circuit, are connected with power supply wiring and ground potential wiring, which are used in common, and are formed in a common region where elements are formed.

20. The optical receiver circuit according to claim 11,
wherein the cathode of a photodiode, a photoelectric conversion circuit that receives an optical signal and converts the optical signal into a current signal, is connected with the first ground potential wiring in the optical receiver circuit through a bypass capacitor, and
wherein the cathode of the photodiode is connected with a power supply for photodiode through a resistor in the optical receiver circuit.

\* \* \* \* \*